United States Patent
Chen et al.

(10) Patent No.: US 6,724,143 B2
(45) Date of Patent: Apr. 20, 2004

(54) PACKAGING STRUCTURE FOR A DISPLAY DEVICE

(75) Inventors: Lai-Cheng Chen, Hsinchu (TW); Wen-Tsang Liu, Taipei (TW); Ping-Song Wang, Taipei Hsien (TW); Chun-Hui Tsai, Hsinchu (TW)

(73) Assignee: Delta Optoelectronics, Inc., Hsin-Chu (TW)

( * ) Notice: Subject to any disclaimer, the term of this patent is extended or adjusted under 35 U.S.C. 154(b) by 0 days.

(21) Appl. No.: 10/153,794

(22) Filed: May 24, 2002

(65) Prior Publication Data

US 2003/0107315 A1 Jun. 12, 2003

(30) Foreign Application Priority Data

Dec. 10, 2001 (TW) ........................................ 90130530 A

(51) Int. Cl.⁷ .............................................. H05B 33/04
(52) U.S. Cl. ........................ 313/512; 313/506; 428/690
(58) Field of Search ................. 313/512, 511, 313/504, 506; 428/690, 917; 445/25, 44; 257/433, 787, 788, 790, 794; 277/650

(56) References Cited

U.S. PATENT DOCUMENTS

| | | | | |
|---|---|---|---|---|
| 5,874,804 A | * | 2/1999 | Rogers | 313/512 |
| 6,210,815 B1 | * | 4/2001 | Ooishi | 428/690 |
| 6,589,675 B2 | * | 7/2003 | Peng | 428/690 |
| 2003/0062830 A1 | * | 4/2003 | Guenther et al. | 313/512 |

* cited by examiner

Primary Examiner—Nimeshkumar D. Patel
Assistant Examiner—K. Guharay
(74) Attorney, Agent, or Firm—Birch, Stewart, Kolasch & Birch, LLP

(57) ABSTRACT

A packaging structure for an OLED/PLED device. The packaging structure has a glass substrate on which a luminescent element is completed, and a sealing cap bonded to the rim of the glass substrate so as to seal the luminescent element within an airtight space. Also, a sealing agent is disposed between the rims of the sealing cap and the glass substrate, wherein the sealing agent is an alloy with a low eutectic point about 100~300° C.

18 Claims, 5 Drawing Sheets

PACKAGING STRUCTURE FOR A DISPLAY DEVICE

BACKGROUND OF THE INVENTION

1. Field of the Invention

The present invention relates to a packaging process for a display device and, more particularly, to a packaging structure for an OLED/PLED device.

2. Description of the Related Art

In an organic electro-luminescence (EL) element used for new-generation panel display devices, such as organic light emitting diode (OLED) or polymer light emitting diode (PLED), electric current applied to specific organic luminescent materials transforms electricity into luminosity. The OLED/PLED device has the advantages of thin profile, light weight, high luminescent efficiency, and low driving voltage. However, as the duration of use increases, the likelihood of moisture and oxygen permeating the organic EL element also increases, causing detachment between the organic luminescent layer and the cathode electrode, cracking of the organic materials, and oxidation of the electrodes. As a result, a so-called 'dark spot', to which electricity is not supplied, is generated, decreasing luminescence and luminescent uniformity.

In order to prevent the internal space of the organic EL element from developing a high humidity condition, a sealing cap is commonly used to package the glass substrate on which metal electrodes and the organic luminescent layer are completed. Also, various technologies reducing the interior humidity have been developed, such as forming photo-hardened resin on the glass substrate, plating metal oxide, fluoride or sulfide on the glass substrate, forming a water-resistant film on the glass substrate, and using an airtight case to package the organic EL element. Nevertheless, other problems, such as leakage current, crosstalk and oxide dissolution, remain to be solved.

FIG. 1 is a sectional diagram showing a packaging structure for an OLED/PLED device according to the prior art. An organic EL element 10 comprises a glass substrate 12, a sealing agent 14 formed on the rim of the glass substrate 12, and a sealing cap 16 bonded to the glass substrate 12 by the sealing agent 14. Thus, the internal space 18 formed by the glass substrate 12 and the sealing cap 16 becomes an airtight container. Also, in the internal space 18, the glass substrate 12 comprises a lamination body 20 formed by a cathode layer 26, an organic luminescent material layer 24 and an anode layer 22. The sealing cap 16 of metal or glass is slightly smaller than the glass substrate 12 to cover the lamination body and reveal predetermined electrodes for driving circuits of the packaging structure.

The sealing agent 14 is polymer agent, such as UV-cured resin, epoxy resin and acrylic resin used in packaging LCD devices. With regard to organic luminescent materials sensitive to oxygen, moisture and high temperature, the polymer agent has poor resistance to moisture in the internal space 18 and poor adhesion between the glass substrate 12 and the sealing cap 16. The epoxy resin commonly used in the sealing agent 14 is a gather-type polymer and needs specific functional groups to carry polymerization out and thus space in position to the polymerization becomes a channel for moisture and oxygen. Also, during polymerization, vias and free volume are formed to become another channel for moisture and oxygen. Therefore, epoxy resin containing a large amount of moisture cannot provide good water/oxygen-resistance ability and easily allows the metal and organic luminescent material layer 24 to peel from the cathode layer 26.

Seeking to solve the problems caused by epoxy resin, a conventional method disposes a drying substance on the bottom of the sealing cap 16 and spaced from the lamination body 20 by an internal space 18 filled with dried inert gas. The drying substance comprises a solid compound, such as BaO, CaO, $CaSO_4$, and $CaCl_2$, which chemically absorbs moisture and maintains its solid state. When a large amount of BaO or CaO is added to the drying substance, the moisture absorbency of the drying substance is increased. Unfortunately, the moisture absorbency is limited when the thickness of the drying substance exceeds a critical value. Thus, a new method of packaging the organic EL element solving the aforementioned problems is called for.

SUMMARY OF THE INVENTION

The present invention provides a packaging structure for an OLED/PLED device, in which a sealing agent is an alloy with a low eutectic point to solve the conventional problems.

The packaging structure has a glass substrate on which a luminescent element is completed, and a sealing cap that is bonded to the rim of the glass substrate so as to seal the luminescent element within an airtight space. Also, a sealing agent is disposed between the rims of the sealing cap and the glass substrate, wherein the sealing agent is an alloy with a low eutectic point about 100~300° C.

Accordingly, it is a principal object of the invention to provide an alloy with a low eutectic point as the sealing agent to provide good adhesion between the glass substrate and the sealing cap in a low melting temperature.

It is another object of the invention to provide the sealing agent without any channel for moisture and oxygen.

Yet another object of the invention is to provide the sealing agent with good resistance to the permeation of water and oxygen from the atmosphere.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

[First Embodiment]

Figure 1:
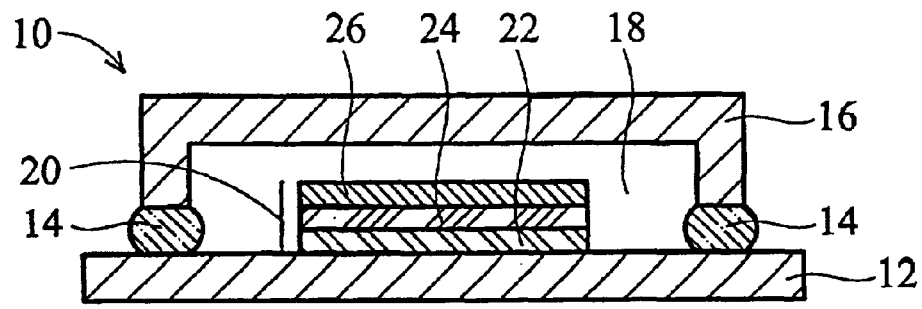
FIG. 1 is a sectional diagram showing a packaging structure for an OLED/PLED device according to the prior art.
Figure 2:
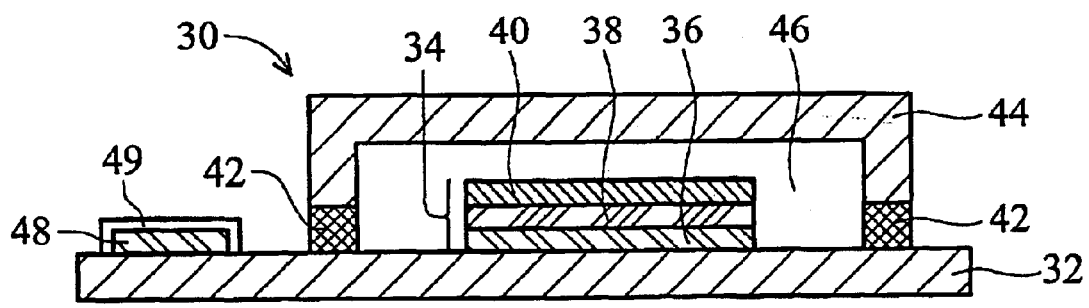
FIG. 2 is a sectional diagram showing a packaging structure for an OLED/PLED device according to the first embodiment of the present invention.

FIG. 2 is a sectional diagram showing a packaging structure for an OLED/PLED device 30 according to the first embodiment of the present invention. An OLED/PLED device 30 comprises a glass substrate 32, a sealing agent 42 formed on the rim of the glass substrate 32, and a sealing cap 44 bonded to the glass substrate 32 by the sealing agent 42. Thus, the internal space 46 formed by the glass substrate 32 and the sealing cap 44 becomes an airtight container. Also, in the internal space 46, the glass substrate 32 comprises a lamination body 34 that is formed by a cathode layer 40, an organic luminescent material layer 38 and an anode layer 36.

The sealing agent 42 is selected from soldering materials, such as mono metal, binary alloy or ternary alloy. The sealing agent 42 has a low eutectic point to provide good adhesion between the glass substrate 32 and the sealing cap 44 in a low melting temperature. Since heat treatment is necessary for the sealing agent 42, a process of solidification from a liquid state can absolutely avoid the formation of continuous vias in the alloy. This ensures that no channel for moisture and oxygen is formed in the sealing agent 42 so as to provide good resistance to the permeation of water and oxygen from the atmosphere. Preferably, the alloy used to form the sealing agent 42 has a eutectic point between 100~300° C. For example, InSn (50~52% In-50~48% Sn) has a eutectic point at 120° C., PbSn has a eutectic point at 180° C., and Sn has a eutectic point at 230° C.

Further, the sealing cap 44 that may be metal or glass is slightly smaller than the glass substrate 32 to cover the lamination body 34 and reveal a predetermined-exposed electrode 48 used for driving circuits of the packaging structure. Moreover, in order to prevent the alloy used in the sealing agent 44 overflowing and electrically connecting to the electrode 48, an insulating layer 49 is needed to cover the exposed surface of the electrode 48. Preferably, the insulating layer 49 is $SiO_2$, $TiO_2$, $Cr_2O_3$ or any other metal oxide.

Figure 3:
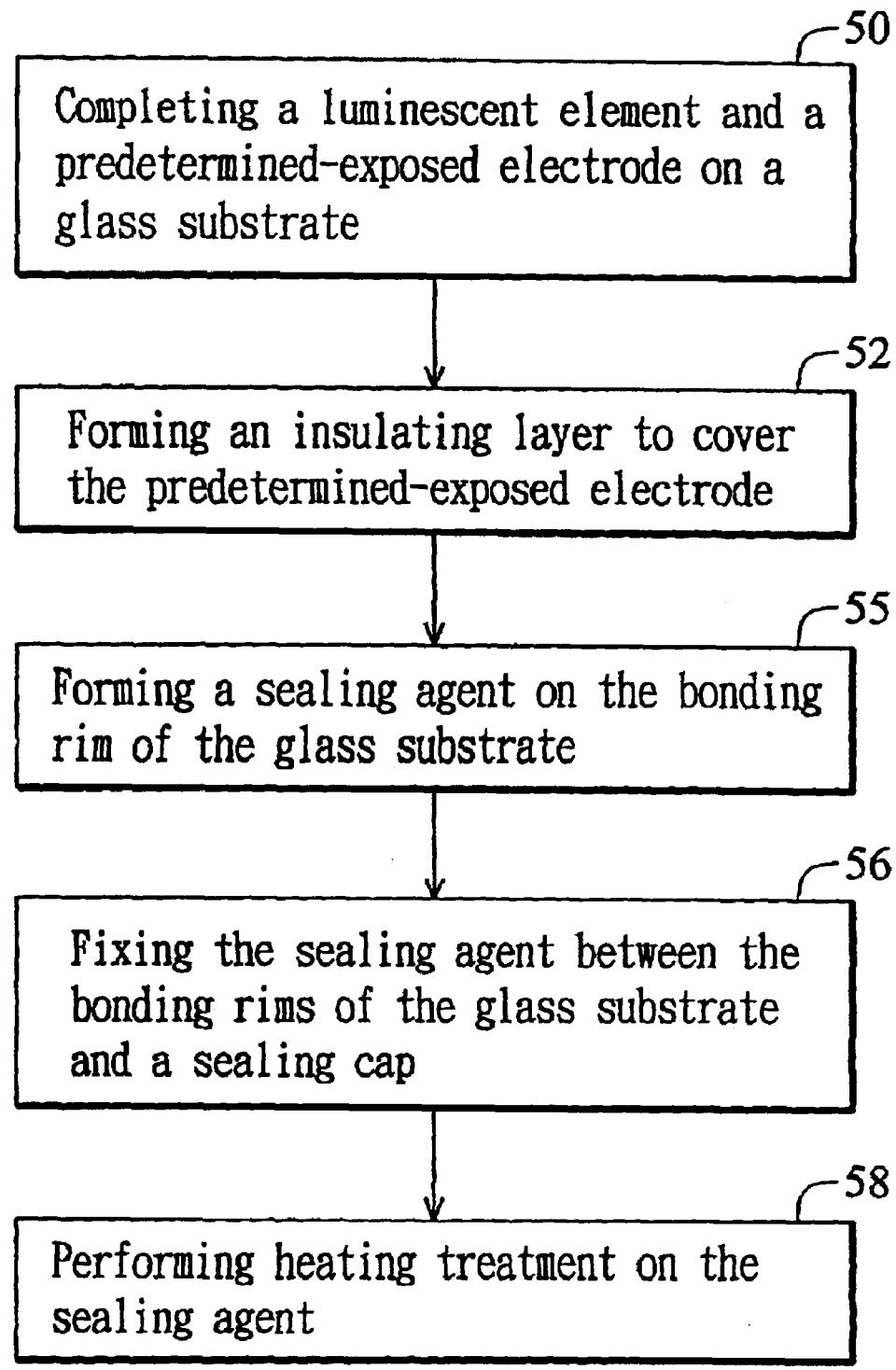
FIG. 3 is a flow chart of a packaging method according to the first embodiment of the present invention.

FIG. 3 is a flow chart of a packaging method according to the first embodiment of the present invention. First, at step 50, the lamination body 34 and predetermined-exposed electrode 48 are completed on the glass substrate 32. Then, at step 52, the insulating layer 49 is deposited to cover the predetermined-exposed electrode 48. Next, at step 55, an alloy with a low eutectic point (such as InSn, PbSn or Sn) is provided in the form of foil, wire or glue on the bonding rim of the glass substrate 32. The alloy with a low eutectic point serves as the sealing agent 42, and the shape and size of the sealing agent 42 are design choices depending on the bonding requirements between the glass substrate 32 and the sealing cap 44. Thereafter, at step 56, a mold is used to fix the sealing agent 42 on the bonding rim between the glass substrate 32 and the sealing cap 44. Finally, at step 58, using a heat treatment, the display device 30 is put into an oven to melt the sealing agent 42 at a low temperature about 100~300° C. This completes packaging of the internal elements of the OLED/PLED device 30.

[Second Embodiment]

Figure 4:
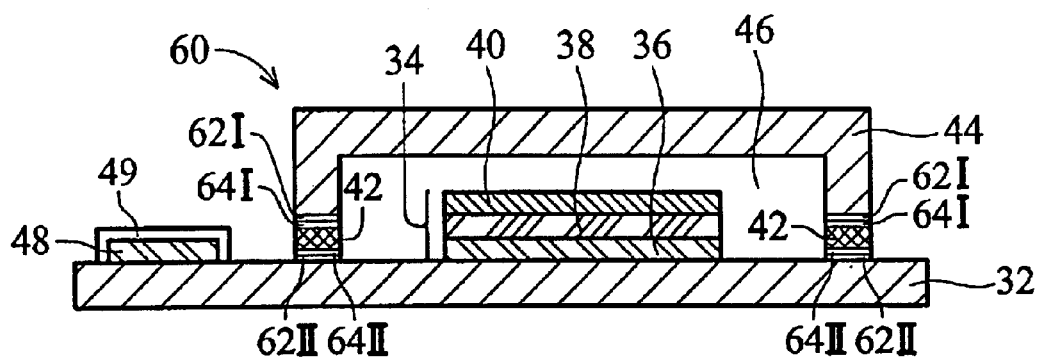
FIG. 4 is a sectional diagram showing a packaging structure for an OLED/PLED device according to the second embodiment of the present invention.

FIG. 4 is a sectional diagram showing a packaging structure for an OLED/PLED device 60 according to the second embodiment of the present invention. To improve the tightness of the packaging structure described in the first embodiment, the second embodiment further provides a first metallic adhesion layer 62I and a first metallic match layer 64I between the sealing cap 44 and the sealing agent 42, and a second metallic adhesion layer 62II and a second metallic match layer 64II between the glass substrate 32 and the sealing agent 42. The metallic adhesion layer 62 is used to improve the adhesion between an alloy with a low eutectic point and glass, and is preferably selected from Cr, Ti, Ta, V or Mo. The metallic match layer 64 is selected from various materials depending on the material used in the sealing agent 42. For example, when the sealing agent 42 is InSn, PbSn or Sn, the metallic match layer 64 is selected from metal or alloy commonly used in a vacuum, such as Au, Cu, Ni and Al. Also, the metallic match layer 64 may be oxide containing Cu, Al, Fe, Ni or Zr. When the sealing agent 42 is PbSn or tin alloy, the metallic match layer 64 may be a double-layered structure containing an Ag layer and a Ni layer.

Figure 5:
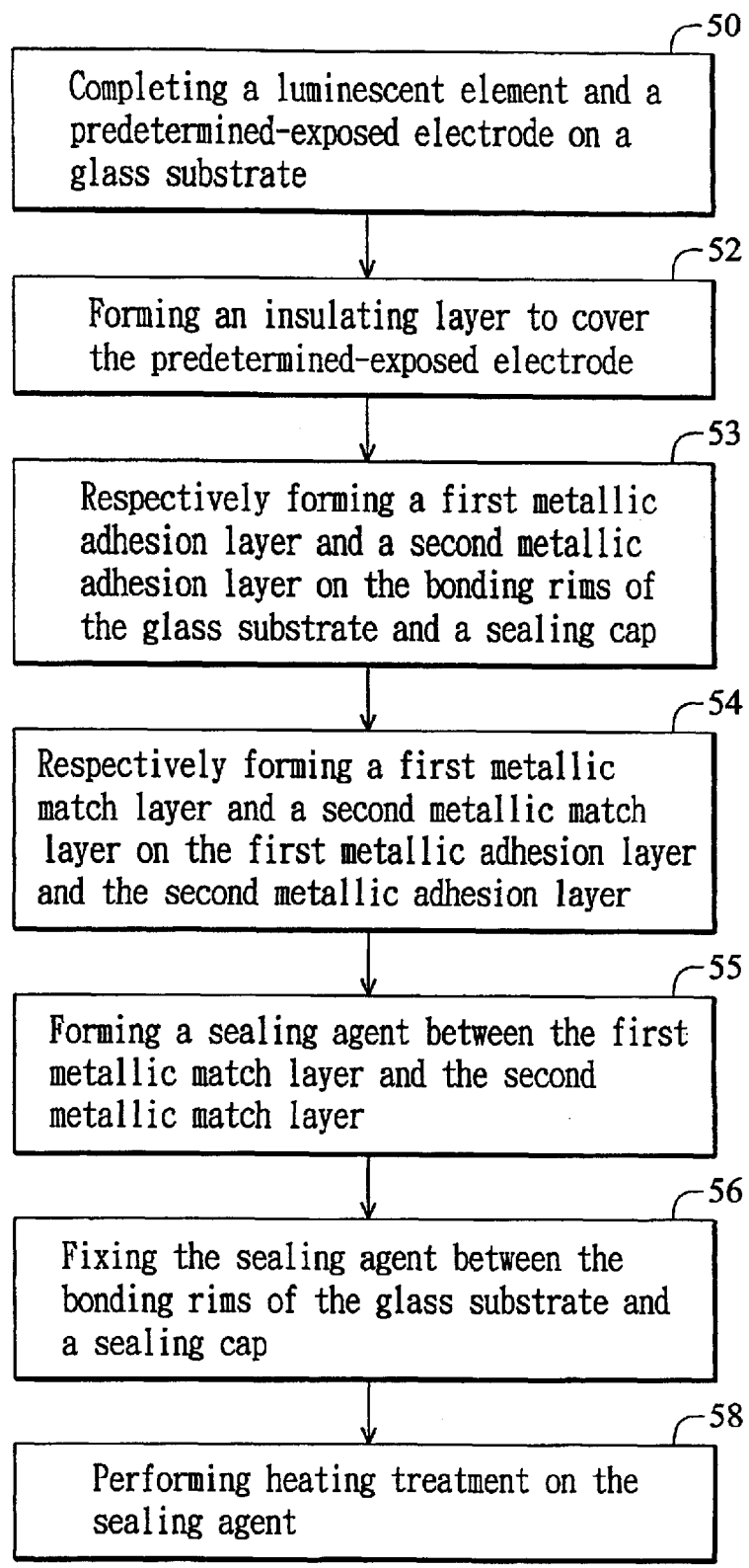
FIG. 5 is a flow chart of a packaging method according to the second embodiment of the present invention.

FIG. 5 is a flow chart of a packaging method according to the second embodiment of the present invention. Compared with the steps in the first embodiment, the added steps in the second embodiment are step 53 and step 54. At step 53, the first metallic adhesion layer 62I and the second metallic adhesion layer 62II are respectively plated on the bonding rims of the sealing cap 44 and the glass substrate 32 after the formation of lamination body 34, the predetermined-exposed electrode 48 and the insulating layer 49. Then, at step 54, the first metallic match layer 64I and the second metallic match layer 64II are respectively plated on the first metallic adhesion layer 62I and the second metallic adhesion layer 62II. Thereafter, at the steps 55, the sealing agent 42 is disposed between the first metallic match layer 64I and the second metallic match layer 64II. Finally, the steps 56 and 58 are the same as described in first embodiment.

[Third Embodiment]

Figure 6A:
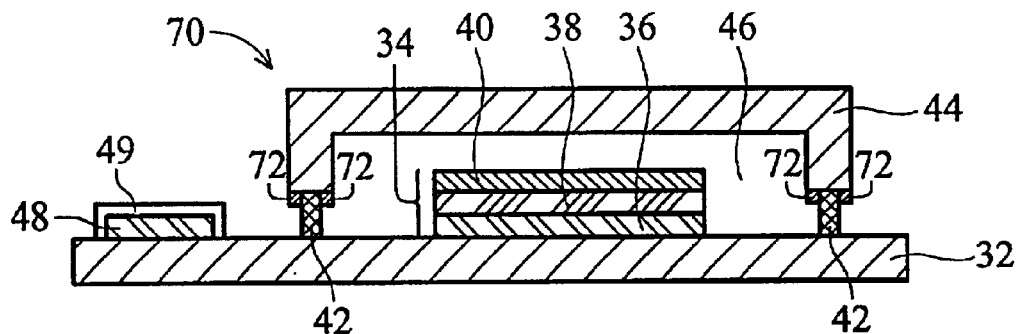
FIGS. 6A and 6B are sectional diagrams showing a packaging structure for an OLED/PLED device according to the third embodiment of the present invention.
Figure 6B:
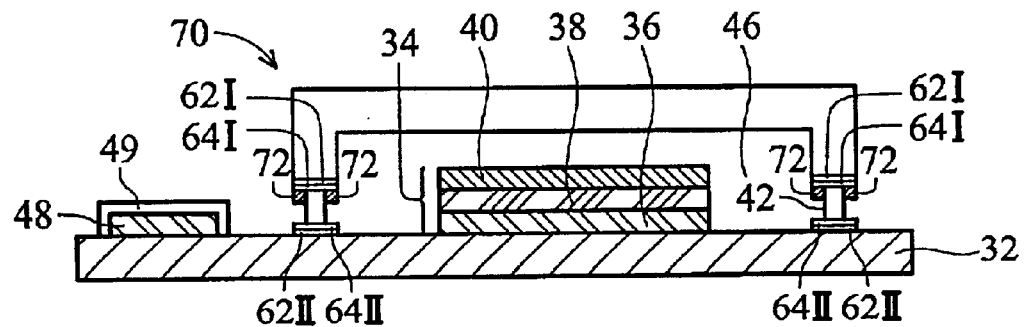

FIGS. 6A and 68 are sectional diagrams showing a packaging structure for an OLED/PLED device 70 according to the third embodiment of the present invention. Since InSn has a good wettability on non-metallic materials, rnSn may adhere to the glass substrate 32/the sealing cap 44 and easily spread during high-temperature treatment. This causes undesired adhesion between sealing agent 42 and glass materials. Accordingly, the third embodiment provides a high-temperature endurable material 72, such as PI (polyimide), ceramics or glass, on the rim of the sealing case 44. Preferably, the high-temperature endurable material 72 is coated or printed to form a trench. Thus, the sealing agent 42 can be disposed within the trench of the high-temperature endurable material 72 to prevent InSn from spreading at a high temperature. The size, shape and altitude of the trench formed in the high-temperature endurable material 72 are design choices depending on the profile of the sealing agent 42. FIG. 6A shows a first structure modified according to the first embodiment. FIG. 68 is a second structure modified according to the second embodiment.

It is to be understood that the present invention is not limited to the embodiments described above, but encompasses any and all embodiments within the scope of the following claims.

What is claimed is:

1. A packaging structure of a display device comprising:
   a glass substrate, wherein a luminescent element is completed on the internal surface of the glass substrate;
   a sealing cap, wherein the rim of the internal surface of the sealing cap is bonded to the bonding rim of the internal surface of the glass substrate so as to seal the luminescent element within an airtight space;
   a first metallic adhesion layer formed on the rim of the internal surface of the sealing cap;
   a first metallic match layer formed on the first metallic adhesion layer;
   a second metallic adhesion layer formed on the rim of the internal surface of the glass substrate;
   a second metallic match layer formed on the second metallic adhesion layer; and
   a sealing agent disposed between the bonding rims of the sealing cap and the glass substrate, wherein the sealing agent is an alloy with a low eutectic point about 100–300° C., and the sealing agent is sandwiched between the first metallic match layer and the second metallic match layer.

2. The packaging structure according to claim 1, wherein the sealing agent is InSn.

3. The packaging structure according to claim 1, wherein the sealing agent is PbSn.

4. The packaging structure according to claim 1, wherein the sealing agent is Sn alloy.

5. The packaging structure according to claim 1, wherein the sealing cap is glass or metal.

6. The packaging structure according to claim 1, wherein the sealing agent is disposed between the first metallic match layer and the second metallic match layer.

7. The packaging structure according to claim 1, wherein the sealing agent is InSn, PbSn or Sn alloy, and each of the first metallic match layer and the second metallic match layer is Au, Cu, Ni, Al or other metal/alloy used in a vacuum.

8. The packaging structure according to claim 1, wherein the sealing agent is InSn, PbSn or Sn alloy, and each of the first metallic match layer and the second metallic match layer is oxide containing Cu, Al, Fe, Ni or Zr.

9. The packaging structure according to claim 1, wherein the sealing agent is PbSn or Sn alloy, and each of the first metallic match layer and the second metallic match layer is a double-layered structure containing a Ag layer and a Ni layer.

10. The packaging structure according to claim 1, wherein each of the first metallic adhesion layer and the second metallic adhesion layer is Cr, Ti, Ta, V or Mo.

11. The packaging structure according to claim 1, further comprising a trench on the rim of the internal surface of the sealing cap, wherein the trench is in opposition to the sealing agent.

12. The packaging structure according to claim 11, wherein the trench is surrounded by a high-temperature endurable material.

13. The packaging structure according to claim 12, wherein the high-temperature endurable material is polyimide, ceramic or glass.

14. The packaging structure according to claim 1, further comprising a predetermined-exposed electrode formed on the internal surface of the glass substrate and outside the airtight space.

15. The packaging structure according to claim 14, wherein the predetermined-exposed electrode is covered by an insulating layer.

16. The packaging structure according to claim 15, wherein the insulating layer is $SiO_2$, $TiO_2$, $Cr_2O_3$ or any other metallic oxide.

17. The packaging structure according to claim 1, wherein the display device is organic light emitting diode (OLED).

18. The packaging structure according to claim 1, wherein the display device is polymer light emitting diode (PLED).

* * * * *